US010706201B1

(12) United States Patent
Ding et al.

(10) Patent No.: US 10,706,201 B1
(45) Date of Patent: Jul. 7, 2020

(54) CIRCUIT DESIGN ROUTING USING MULTI-PANEL TRACK ASSIGNMENT

(71) Applicant: Cadence Design Systems, Inc., San Jose, CA (US)

(72) Inventors: Yi-Xiao Ding, Austin, TX (US); Mehmet Can Yildiz, Austin, TX (US)

(73) Assignee: Cadence Design Systems, Inc., San Jose, CA (US)

(*) Notice: Subject to any disclaimer, the term of this patent is extended or adjusted under 35 U.S.C. 154(b) by 0 days.

(21) Appl. No.: 16/292,012

(22) Filed: Mar. 4, 2019

(51) Int. Cl.
*G06F 30/30* (2020.01)
*G06F 30/394* (2020.01)

(52) U.S. Cl.
CPC ............ *G06F 30/394* (2020.01); *G06F 30/30* (2020.01)

(58) Field of Classification Search
CPC ....................................... G06F 30/30
USPC ................................ 716/126, 129
See application file for complete search history.

(56) References Cited

U.S. PATENT DOCUMENTS

| | | | | |
|---|---|---|---|---|
| 5,032,991 A | * | 7/1991 | Davidson et al. | G01R 31/2808 716/126 |
| 5,812,417 A | * | 9/1998 | Young | G06F 30/30 716/104 |
| 2018/0285507 A1 | * | 10/2018 | Kazda et al. | H03K 19/17752 |
| 2018/0357033 A1 | * | 12/2018 | Welch et al. | G06F 3/1446 |

* cited by examiner

*Primary Examiner* — Sun J Lin
(74) *Attorney, Agent, or Firm* — Schwegman Lundberg & Woessner, P.A.

(57) ABSTRACT

Various embodiments provide for circuit design routing using a track assignment based on a plurality of panels (also referred to herein as a multi-panel track assignment). According to some embodiments, a track assignment of a wire within a particular panel is performed based on a primary panel bound or limit and a secondary panel bound or limit. For instance, during a track assignment for a particular wire falling within a particular panel, an embodiment can first attempt to assign the particular wire to a track that falls within panels within the primary panel bound and, if deemed not possible (e.g., due to a DRC, violation or congestion issue), the embodiment can then assign the particular wire to a track that falls within panels within the secondary panel bound.

20 Claims, 7 Drawing Sheets

200

202 — DIVIDE CIRCUIT DESIGN INTO GRID OF CELLS THAT FORMS PLURALITY OF CONSECUTIVE PANELS

204 — ROUTE NETWORK OF CIRCUIT DESIGN BASED ON GRID OF CELLS

206 — PERFORM TRACK ASSIGNMENT FOR SET OF WIRES OF NETWORK BASED ON PLURALITY OF CONSECUTIVE PANELS, FIRST PANEL BOUND, AND SECOND PANEL BOUND DEFINING SET OF CONSECUTIVE PANELS LARGER THAN THE FIRST BOUND

CIRCUIT DESIGN ROUTING USING MULTI-PANEL TRACK ASSIGNMENT

TECHNICAL FIELD

Embodiments described herein relate to circuit design and, more particularly, to systems, methods, devices, and instructions for routing a network of a circuit design using track assignment based on a plurality of panels, which may be part of electronic design automation (EDA).

BACKGROUND

Electronic design automation (EDA) software systems commonly perform routing of networks (nets) of circuit designs, such as clock networks (hereafter, clock nets). Usually, net routing can be performed in two phases, where the first phase involves routing guides that attempt to generate timing-aware/timing-based global routing of nets, and the second phase involves detailed routing of nets with specific wires (e.g., metal traces) based on the routing guides, while attempting to resolve/avoid one or more design rule violations.

Global routing can comprise two-dimensional (2D) net routing, layer assignment of wires of nets, or track assignment of wires of nets. Resolving congestion and major design rule constraints (DRCs) during global routing can facilitate detailed routing of nets. Conventional global routing can route nets of a circuit design by dividing the circuit design (e.g., each layer of the circuit design) into a grid of cells (also referred to as "global routing cells" or "g-cells"), where each g-cell comprises a set number of resources (e.g., horizontal and vertical resources, such as tracks) for routing a net. Global routing can then route a net of the circuit design by assigning the net to a set of specific g-cells and a set of specific layers (metal layer) of the circuit design. Generally, using g-cells permits global routing to speed up the process of finding the net routing solutions by analyzing routing congestion based on g-cell congestion (e.g., a g-cell is considered congested if number of resources of the g-cell is less than what is needed to route a net through the g-cell) and by reducing the number of pathways to consider for net routing.

In some instances, conventional routing (e.g., conventional global routing) performs track assignment of wires based on panels (e.g., panel by panel), where each panel comprises a defined row of g-cells on one or more layers of the circuit design (e.g., metal layers M1, M2, M3, etc.) that fall within that defined row of g-cells. Traditionally, track assignment assigns a wire falling within a particular panel to a track within the same particular panel, and such a track assignment is determined independent of any wire track assignment within other (e.g., adjacent) panels. As such, traditional track assignment can not only cause wire overlap, but also cause DRCs to form based on wires or routing blockages that exist in different (e.g., neighboring) panels.

BRIEF DESCRIPTION OF THE DRAWINGS

Various ones of the appended drawings merely illustrate example embodiments of the present disclosure and should not be considered as limiting its scope.

DETAILED DESCRIPTION

Various embodiments provide for circuit design routing using track assignment based on a plurality of panels (consecutive panels), which can permit a wire falling within a particular panel to be assigned to a track of a neighboring panel in certain circumstances (e.g., circumstances involving a design rule constraint (DRC) or routing congestion). For instance, use of some embodiments enable track assignment to be performed with respect to a particular panel while considering DRCs formed/caused by wires or routing blockages (also referred to as "blockages") in other (e.g., adjacent) panels. Additionally, use of some embodiments enable routing (e.g., global routing) to resolve panel congestion (congestion of g-cells falling within a panel) using track assignment. Depending on the embodiment, track assignment based on a plurality of panels (as described herein) can be performed as part of global routing, as part of detailed routing, or as an intermediate process performed between global routing and detailed routing.

According to some embodiments, track assignment of a wire within a particular panel is performed based on a primary panel bound or limit (e.g., soft panel bound) and a secondary panel bound or limit (e.g., hard panel bound). For instance, with respect to a particular panel, a primary panel bound can comprise a single panel (i.e., only the particular panel), while a secondary panel bound can comprise three panels with respect to the particular panel (e.g., the particular panel and the two panels immediately adjacent to the particular panel). In such an instance, for a particular wire falling within the particular panel, an embodiment can first attempt to assign the particular wire to a track that falls within panels within the primary panel bound (e.g., any track within the particular panel) and, if deemed not possible (e.g., due to a DRC violation or congestion issue), can then assign the particular wire to a track that falls within a panel within the secondary panel bound (e.g., to any track within either of the two panels adjacent to the particular panel). For some embodiments, a penalty is applied to assigning a wire to a track that falls within a panel within the secondary panel bound. In doing so, when there is an issue (e.g., congestion or DRC) to be resolved by track assignment, by applying a penalty for assigning a wire outside its panel, an embodiment can be encouraged to assign a track inside its panel (e.g., to honor a two-dimensional routing solution) rather than assign the wire outside its panel.

As used herein, a panel adjacent to a particular panel can include, for example, a panel that is the next row above or below the particular panel. In this way, various embodiments can implement circuit design routing using a track assignment based on multiple panels (also referred to herein as "multi-panel track assignment"). Additionally, various embodiments described herein use parallel processing, such as multi-threading, to concurrently perform track assignment on a plurality of consecutive panels (e.g., each particular thread performing track assignment with respect to one or more wires falling within a particular panel). Accordingly, some embodiments use a process or thread scheduling scheme that enables individual processes/threads to concurrently perform track assignment for their respective panels based on primary and secondary panel bounds as described herein. With respect to some embodiments described herein, a first panel bound can represent a primary panel bound, and a second panel bound can represent a secondary panel bound. Additionally, the first panel bound, the second panel bound, or both can be predetermined by a user (e.g., user of an EDA), and can be predetermined by the user prior to a circuit design routing process (e.g., global routing process) commencing.

For some embodiments, wires of a circuit design are initially grouped according to a plurality of consecutive panels based on cell (e.g., g-cell) and layer information associated with the wires. Subsequently, the number of track assignment rounds (also referred to herein as an assignment round) that will be performed is determined based on how many panels fall within the secondary panel bound. For example, where the primary panel bound comprises a particular panel and the secondary panel bound comprises a single neighboring panel above and below the particular panel, the number of panels falling within the secondary panel bound would be three. In such an instance, an embodiment can determine the number of track assignment rounds to be three. In another example, where the primary panel bound comprises a particular panel and the secondary panel bound comprises the two panels above and the two panels below the particular panel, the number of panels falling within the secondary panel bound would be five. In such an instance, an embodiment can determine the number of track assignment rounds to be five.

Various embodiments described herein use a scheduler capable of panel and thread assignments that enable multi-threaded track assignment based on a plurality of panels, as described herein. Over multiple track assignment rounds, the scheduler can determine (e.g., select) the panels of wires to assign during a given track assignment round and determine assignment of a track assignment thread to each of those determined panels. For some embodiments, the scheduler selects and assigns panels to threads, and schedules those threads to different track assignment rounds to avoid crosstalk or data collisions between different panels.

For various embodiments, during an initial track assignment round, a scheduler (e.g., multi-threaded scheduler for track assignment operations) selects which of a plurality of initial panels (from the plurality of consecutive panels) is going to be assigned to a thread, and determines to which threads. According to some embodiments, the scheduler selects the plurality of initial panels based on the primary panel bound and the secondary panel bound to be considered while performing track assignment on a particular panel. For instance, the plurality of initial panels can be selected such that the secondary panel bounds do not overlap. In this way, during a given track assignment round, a scheduler of an embodiment can avoid crosstalk or data collision between different panels during execution of concurrent threads for the given track assignment round. For example, where the secondary panel comprises a single panel above and a single panel below with respect to a particular panel, each of the initial panels selected would he spaced apart by at least two panels. In another example, where the secondary panel comprises two panels above and two panels below with respect to a particular panel, each of the initial panels selected would be spaced apart by at least four panels. Once the plurality of initial panels is selected, and each initial panel is assigned to a particular thread (e.g., one thread for each initial panel selected), track assignment can then be performed in parallel for those selected panels by their particular assigned threads. Each thread can perform track assignment on its assigned initial panel based on (e.g., while considering) the primary panel bound and the secondary panel bound, as described herein. After each of the assigned threads completes track assignment for its respective initial panel, the next track assignment round begins if the determined number of track assignment rounds as determined based on the primary panel bound and the secondary panel bound) has not been completed.

For some embodiments, the number of threads available for performing track assignment during a given track assignment round is less than the number of panels selected for track assignment during the given track assignment round. In such a case, once a given thread has completed track assignment with respect to its assigned panel, the given thread can be reassigned to another panel that is still pending tracking assignment during the current track assignment round.

Depending on the embodiment, a track assignment round counter or the like can be maintained and updated, which can enable some embodiments to determine how many track assignment rounds have been performed at the end of each track assignment round.

If a next track assignment round is performed (after the last round has completed), during a current track assignment round, the scheduler can select a plurality of next panels to be assigned to a thread, and determine to which threads. For some embodiments, the scheduler selects the plurality of next panels based on the primary panel bound, the secondary panel bound, and the panels already processed during a prior track assignment round. For instance, each of the next panels can be a panel immediately above or below each of the last panels. Once the plurality of next panels is selected, and each next panel is assigned to a particular thread (e.g., one thread for each next panel selected), track assignment can be performed in parallel for those selected next panels by their particular assigned threads. As before, each thread can perform track assignment on its assigned next panel based on the primary panel bound and the secondary panel bound, as described herein. After each of the assigned threads completes track assignment for its respective next panel, another next track assignment round begins if the determined number of track assignment rounds (as determined based on the primary panel bound and the secondary panel bound) has not been completed.

After the determined number of track assignment rounds is completed, one or more local connections can be generated for the one or more track-assigned wires that result from the track assignment rounds.

By various embodiments, a wire can be assigned to a track of a different panel instead of being restricted to a panel the wire is currently associated with. In this way, various embodiments can assign a wire a track to a neighboring panel (neighboring panel that falls within the secondary panel bound) when beneficial, such as to avoid/resolve DRCs (e.g., formed by wires/blockages from different panels) or to avoid/resolve congestion. For instance, an embodiment can spread wires to neighboring panels in case there is a congestion in a current panel. Additionally, by being aware of assigned wires/blockages from neighboring panels during track assignments, an embodiment can perform track assignment while avoiding DRCs formed by circuit elements in other different panels. Furthermore, compared to traditional circuit design routing and track assignments, an embodiment described herein can reduce the runtime overhead of circuit design routing by avoiding or resolving DRCs and congestions during early routing phases (e.g., prior to detailed routing) rather than in later routing phases (e.g., detailed routing) when routing operations have more runtime overhead.

Depending on the embodiment, the methodologies described herein can be performed in whole or in part during global routing performed on a circuit design or during detailed routing performed on the circuit design.

As used herein, a panel can comprise a defined (or particular) row of cells (e.g., g-cells) on one or more layers (e.g., each metal layer) of a circuit design. For some embodiments, a given panel comprises a three-dimensional portion (e.g., cross section) of a circuit design formed by a defined row of g-cells on each layer of the circuit design. With respect to a given panel, each layer of a circuit design can have its own set of tracks for the given panel, where the set of tracks traverses across the row of g-cells (of the given panel) on that layer. During track assignment, an embodiment can assign a wire to a track associated with one or more consecutive g-cells.

As used herein, a routing blockage (or routing obstacle) can comprise a defined area of a circuit design that serves as an obstruction with respect to routing (e.g., routing a wire associated with a network of the circuit design, such as a clock net) through the defined area. For example, a routing blockage can be caused by a macro block included by a circuit design, which may be associated with a circuit design intellectual property (IP) block. A given routing blockage can comprise an area covering one or more layers of a circuit design (e.g., layers M1, M2, and M3). For various embodiments, circuit design routing routes a wire around a routing blockage, and a track assignment based on a plurality of panels (as described herein) can assist in routing the wire around the routing blockage.

As used herein, global routing can comprise determining a routing plan for routing a physical wire (e.g., interconnect line or wire) within a circuit design between two or more nodes of circuit design (e.g., two pins or a source and a pin). For instance, global routing can route a wire (of a net of the circuit design) within the circuit design by dividing the circuit design (e.g., dividing each of one or more layers of the circuit design) into a grid of cells (e.g., g-cells), where each cell comprises a set number of resources (e.g., horizontal and vertical resources, such as tracks) for routing the wire. For some embodiments, each layer of a circuit design comprises its own grid of cells (e.g., g-cells). Additionally, for some embodiments, a routing blockage of a circuit design (e.g., on a layer of the circuit design) is marked with respect to a cell (e.g., g-cell) in the grid. Global routing can consider/account for one or more routing blockages of the circuit design when determining a route plan for a wire within the circuit design.

Global routing can route a wire (of the net) by assigning the net to a set of specific cells and a set of specific layers (metal layers) of the circuit design. In doing so, global routing can generate a routing plan for the wire that describes a set of connected cells (e.g., g-cells), between two or more nodes of the circuit design, that does not include obstructed cells. The routing plan (e.g., global routing plan) can comprise one or more routing guides that serve as "loose" routing paths or routing areas within which detailing routing can route a physical wire between two or more nodes (e.g., pins) of a circuit design.

As used herein, detailed routing can comprise routing a physical wire (e.g., interconnect wire) within a circuit design, between two or more nodes of the circuit design, based on a routing plan determined by global routing for the circuit design. The routing plan can provide a detailed routing process with a topology for routing wires, which in turn can enable detailed routing to route wires without violating one or more design rule constraints (DRCs) associated with a circuit design. This can be referred to as detailed routing being performed with clean DRCs. Accordingly, for some embodiments, global routing is performed on a circuit design prior to detailed routing being performed on the circuit design. Generally, global routing can be performed on a circuit design faster than performing detailing routing on the same circuit design. The routed wires of a circuit design can form a network (also referred to as a "net") of the circuit design.

Reference will now be made in detail to embodiments of the present disclosure, examples of which are illustrated in the appended drawings. The present disclosure may, however, be embodied in many different forms and should not be construed as being limited to the embodiments set forth herein.

Figure 1:
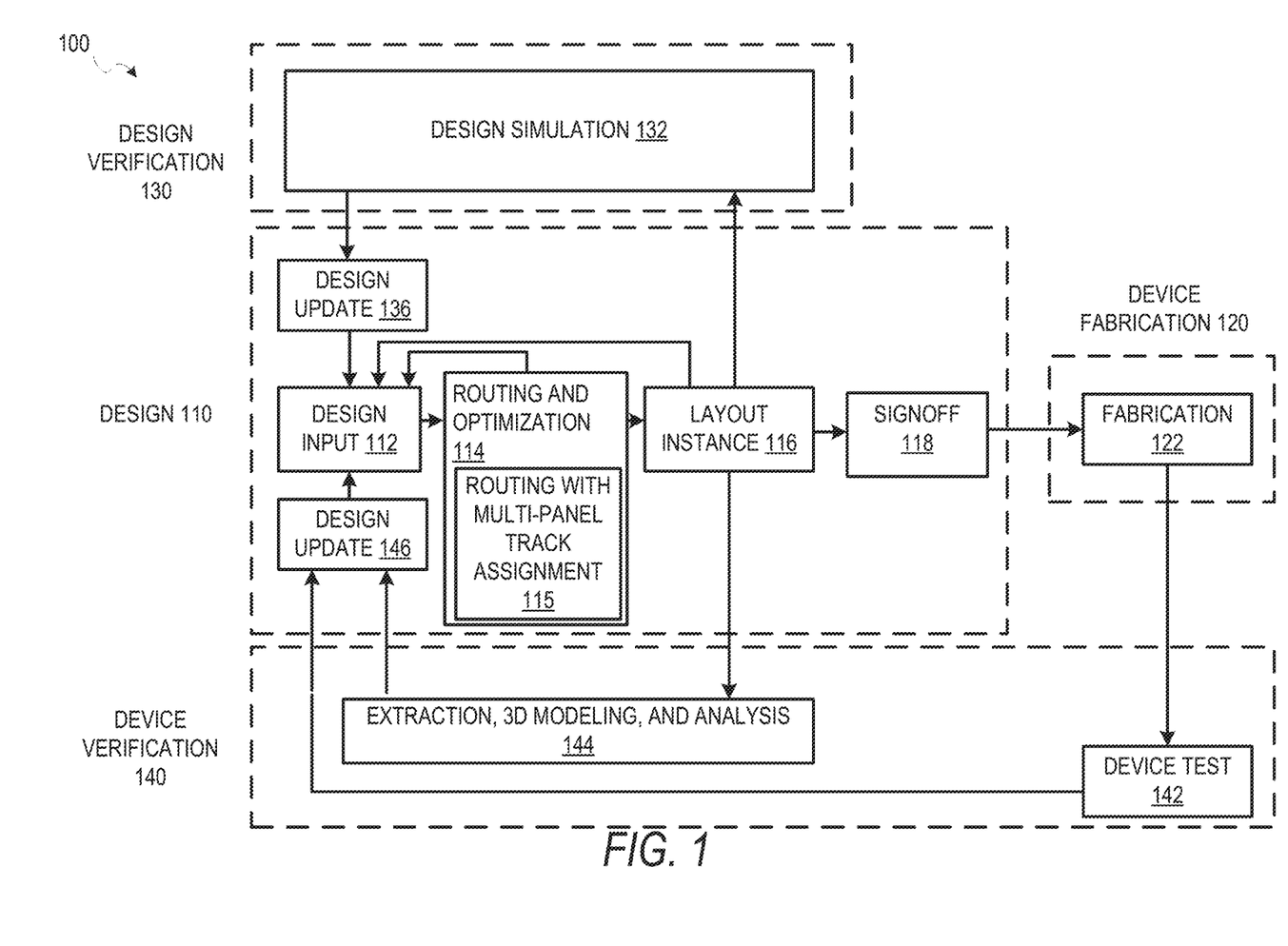
FIG. 1 is a diagram illustrating an example design process flow for circuit design routing using track assignment based on a plurality of panels, according to some embodiments.

FIG. 1 is a diagram illustrating an example design process flow 100 for circuit design routing using track assignment based on a plurality of panels (also referred to as multi-panel track assignment), according to some embodiments. As shown, the design process flow 100 includes a design phase 110, a device fabrication phase 120, a design verification phase 130, and a device verification phase 140. The design phase 110 involves an initial design input 112 operation where the basic elements and functionality of a device are determined, as well as revisions based on various analyses and optimization of a circuit design. This design input 112 operation is where block instances are used in the circuit design and any additional circuitry for the design around the blocks is selected. The initial strategy, tactics, and context for the device to be created are also generated in the design input 112 operation, depending on the particular design algorithm to be used.

In some embodiments, following an initial selection of design values in the design input 112 operation, routing, timing analysis, and optimization are performed in a routing and optimization 114 operation, along with any other automated design processes. As shown, the routing and optimization 114 operation includes a routing with multi-panel track assignment 115 operation, which may be performed in accordance with various embodiments described herein. For some embodiments, routing during the routing and optimization 114 operation comprises a global routing (e.g., global routing phase) and a detailed routing (e.g., detailed routing phase), and the routing with multi-panel track assignment 115 operation is performed as part of the global routing phase. The detailed routing phase can be performed based on output (e.g., one or more routing guides/path/areas) determined by the global routing phase.

While the design process flow 100 shows optimization occurring prior to a layout instance 116, routing (e.g., the routing with multi-panel track assignment 115 operation), timing analysis and optimization may be performed at any time to verify operation of a circuit design. For instance, in various embodiments, timing analysis in a circuit design may be performed prior to routing of connections in the circuit design, after routing, during register transfer level (RTL) operations, or as part of a signoff 118, as described below.

After design inputs are used in the design input 112 operation to generate a circuit layout, and any of the routing and optimization 114 operations are performed, a layout is generated in the layout instance 116. The layout describes the physical layout dimensions of the device that match the design inputs. Prior to this layout being provided to a fabrication 122 operation, the signoff 118 is performed on the circuit design defined by the layout.

After signoff verification by the signoff 118, a verified version of the layout is used in the fabrication 122 operation to generate a device, or additional testing and design updates may be performed using designer inputs or automated updates based on design simulation 132 operations or extraction, 3D modeling, and analysis 144 operations. Once the device is generated, the device can he tested as part of device test 142 operations, and layout modifications generated based on actual device performance.

As described in more detail below, a design update 136 from the design simulation 132; a design update 146 from the device test 142 or the extraction, 3D modeling, and analysis 144 operations; or the design input 112 operation may occur after the initial layout instance 116 is generated. In various embodiments, whenever design inputs are used to update or change an aspect of a circuit design, a timing analysis and the routing and optimization 114 operation may be performed.

Figure 2:
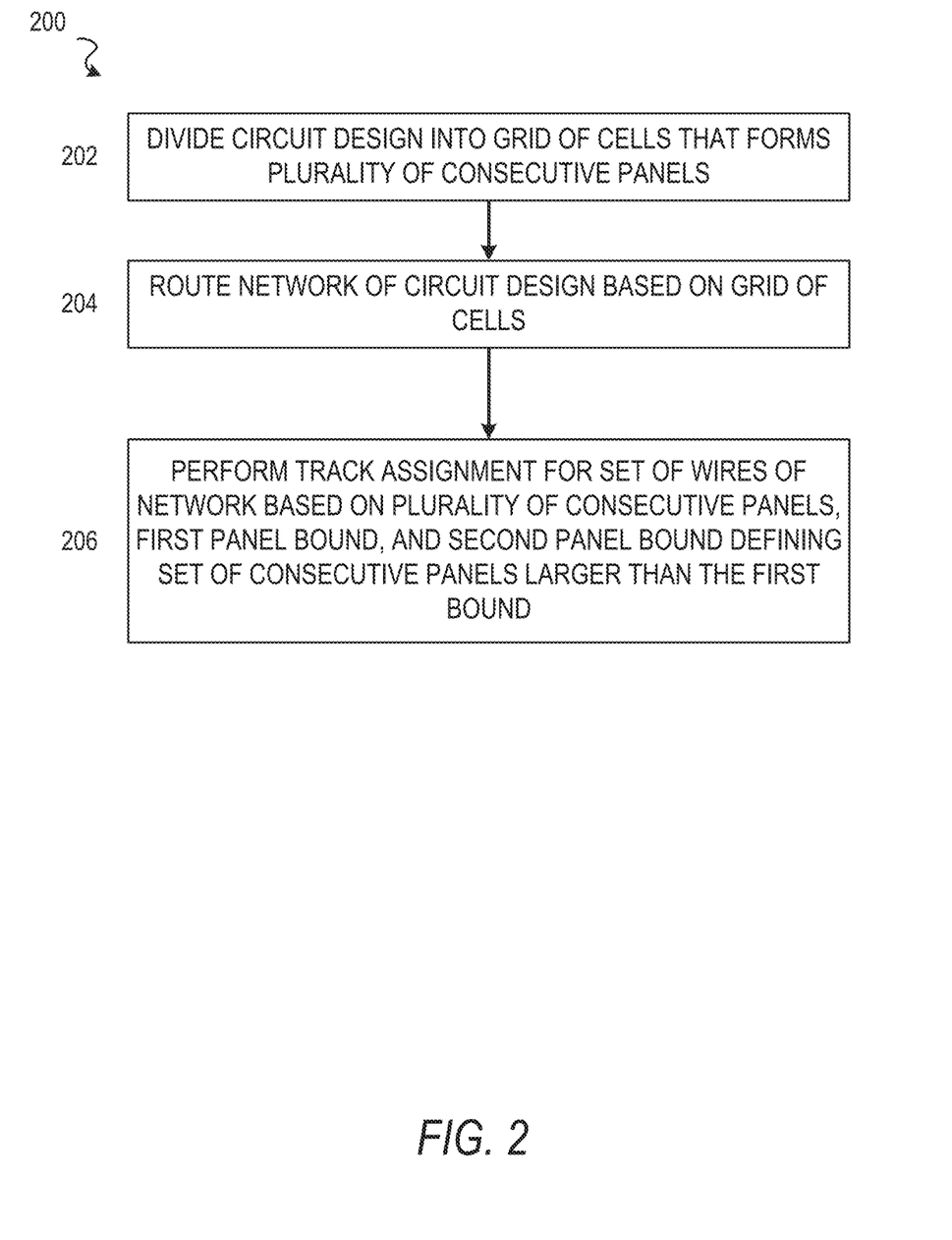
FIGS. 2 through 4 are flowcharts illustrating example methods for circuit design routing using track assignment based on a plurality of panels, according to some embodiments.
Figure 3:
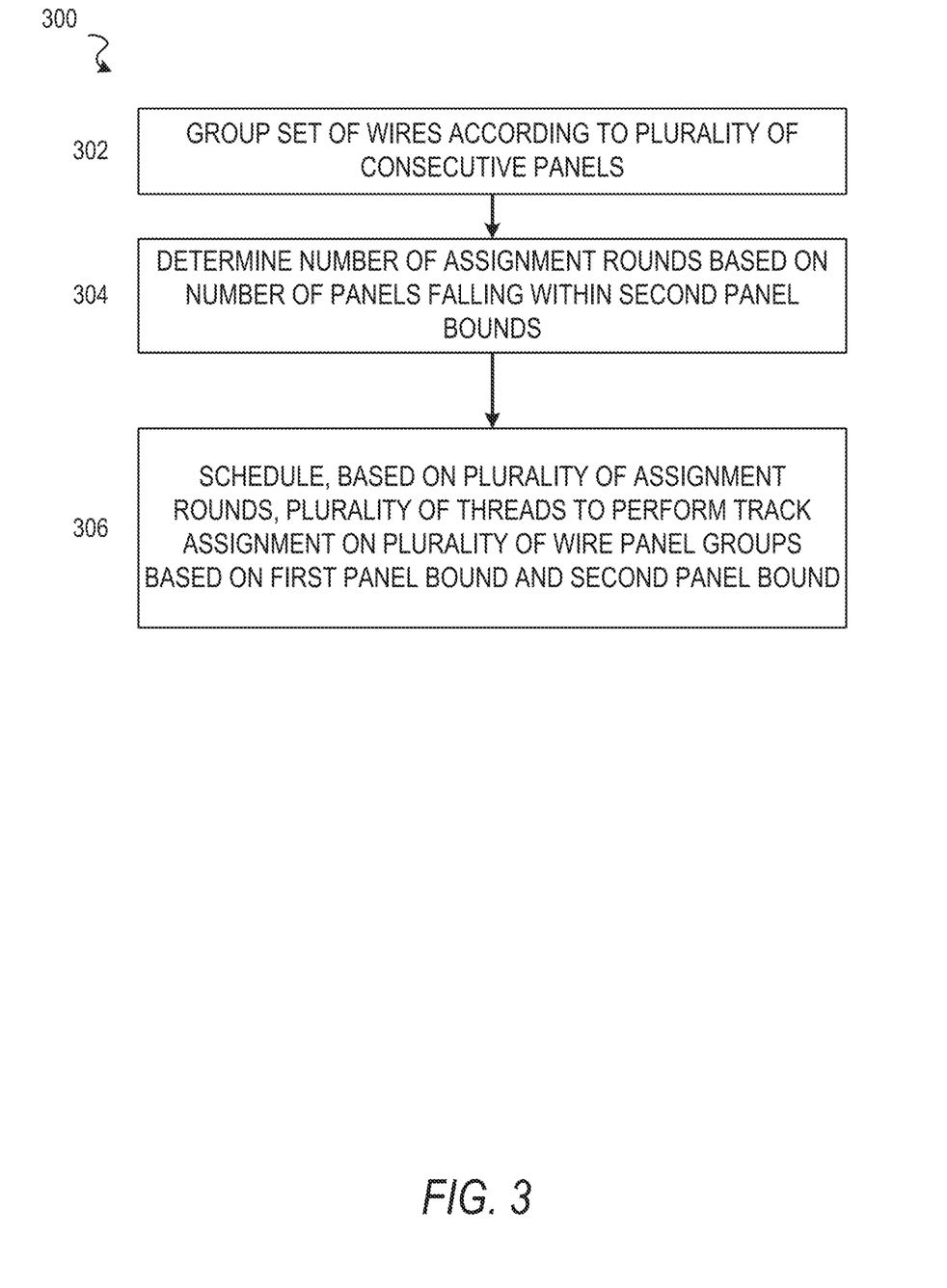
Figure 4:
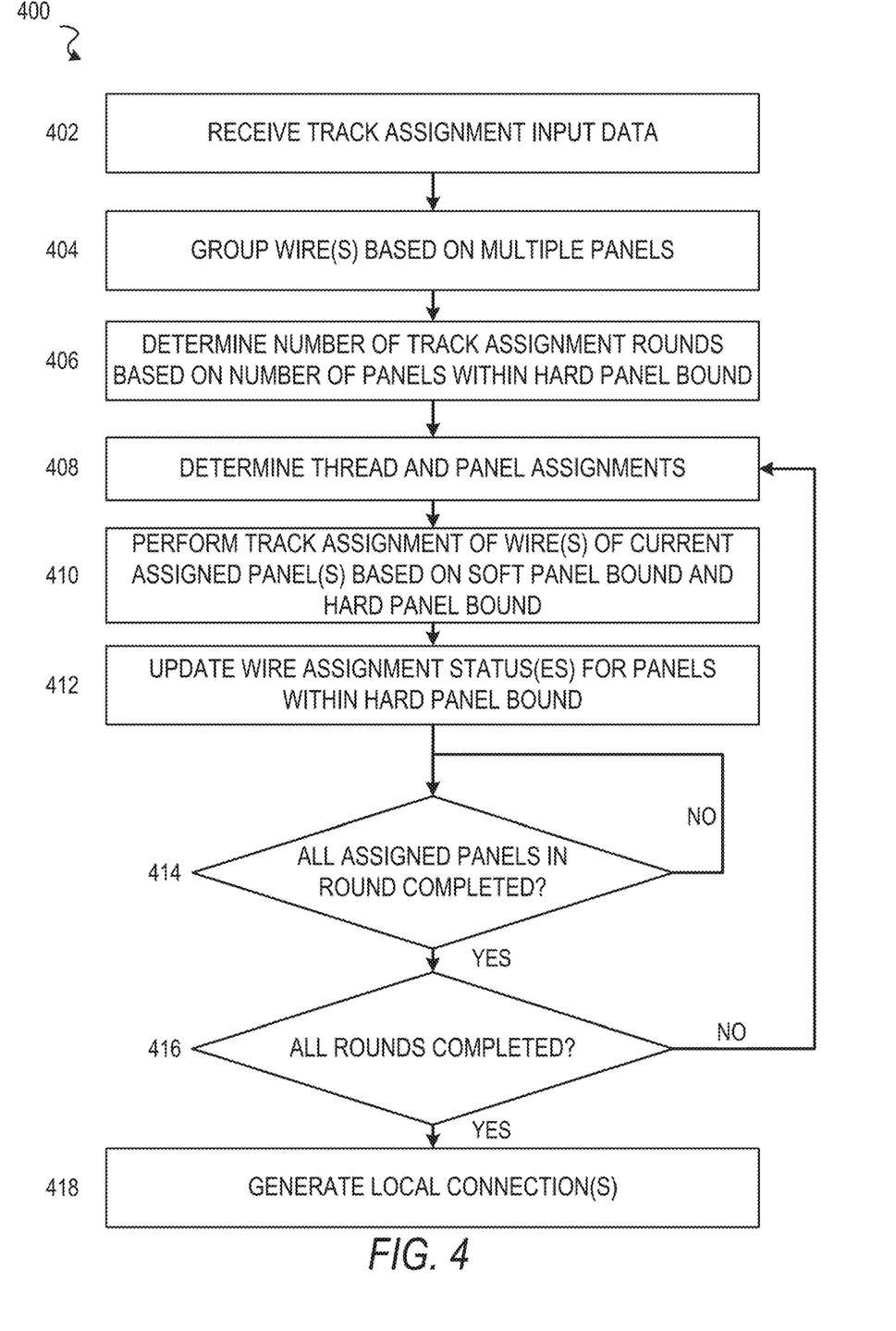

FIGS. 2 through 4 are flowcharts illustrating example methods for circuit design routing using track assignment based on a plurality of panels, according to some embodiments. It will be understood that example methods described herein may be performed by a device, such as a computing device executing instructions of an EDA software system, in accordance with some embodiments. Additionally, example methods described herein may be implemented in the form of executable instructions stored on a computer-readable medium or in the form of electronic circuitry. For instance, the operations of a method 200 of FIG. 2 may be represented by executable instructions that, when executed by a processor of a computing device, cause the computing device to perform the method 200. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel.

Referring now to FIG. 2, the flowchart illustrates the example method 200 for circuit design routing using track assignment based on a. plurality of panels, according to some embodiments. For some embodiments, the method 200 is performed as part of a routing process applied to a circuit design (e.g., by an EDA software system). For instance, the method 200 can be performed as part of a global routing process, as part of a detailed routing process, or some part of each, as applied to a circuit design. An operation of the method 200 (or another method described herein) can be performed by a hardware processor (e.g., central processing unit or graphics processing unit) of a computing device (e.g., desktop, server, etc.

The method 200 as illustrated begins with operation 202 dividing a circuit design into a grid of cells that forms a plurality of consecutive panels. According to some embodiments, each panel in the plurality of consecutive panels comprises a defined row of cells of the grid of cells. Each panel in the plurality of consecutive panels can comprise a defined row of cells of the grid of cells on each layer of a plurality of layers of the circuit design. Additionally, each panel in the plurality of consecutive panels can comprise a set of tracks that traverse across a different row of cells of the grid of cells. The circuit design can comprise a plurality of layers, and each different row of cells is disposed on each layer of the plurality of layers. In this way, each panel can comprise a three-dimensional portion (e.g., cross section) of the circuit design corresponding to a row of cells.

The method 200 continues with operation 204 routing a network of the circuit design based on the grid of cells generated by operation 202. According to some embodiments, the routing is performed as part of global routing that is performed on the circuit design. The routing can comprise performing two-dimensional routing on the circuit design (e.g., on the network of the circuit design), performing layer assignment on the circuit design (e.g., on the network of the circuit design), or both. As described herein, the network of the circuit design can comprise a set of wires between different nodes of the circuit design.

The method 200 continues with operation 206 performing track assignment for a set of wires of the network based on the plurality of consecutive panels, a first panel bound, and a second panel bound. According to some embodiments, the first panel bound defines a first set of consecutive panels relative to a particular panel of the plurality of consecutive panels, and the second panel bound defines a second set of consecutive panels relative to the particular panel such that the second set of consecutive panels is larger than the first set of consecutive panels. For some embodiments, the second set of consecutive panels (relative to the particular panel) comprises some or all of the first set of consecutive panels (relative to the particular panel). For example, the first set of consecutive panels can comprise a single panel, and the second set of consecutive panels comprises three panels. The second set of consecutive panels can comprise the particular panel, a first panel adjacent to a top border of the particular panel, and a second panel adjacent to a bottom border of the particular panel. The second set of consecutive panels can further comprise a third panel adjacent to a top border of the first panel, and a fourth panel adjacent to a bottom border of the second panel.

Operation 206 can be performed after performing two-dimensional routing on the circuit design (e.g., a network of the circuit design), after performing layer assignment on the circuit design (e.g., on the network of the circuit design), or both. After operation 206, an embodiment can perform detailed routing on the circuit design (e.g., on the network of the circuit design). An example of how some embodiments can perform track assignment of the set of wires is described with respect to FIG. 3.

Referring now to FIG. 3, the flowchart illustrates an example method 300 for circuit design routing using track assignment based on a plurality of panels, according to some embodiments. Like the method 200 of FIG. 2, the method 300 may be performed as part of a global routing process, as part of a detailed routing process, or some part of each, as applied to a circuit design. In particular, for some embodiments, the method 300 is performed as part of operation 206 of the method 200 described above with respect to FIG. 2. An operation of the method 300 can be performed by a hardware processor.

The method 300, as illustrated, begins with operation 302 grouping a set of wires (of a network of a circuit design) according to a plurality of consecutive panels to produce a plurality of wire panel groups. The method 300 continues with operation 304 determining a number of assignment rounds based on a number of panels falling within a second panel bound. For some embodiments, the determined number of assignment rounds equals the number of panels falling within the second panel bound.

The method 300 continues with operation 306 scheduling, based on a plurality of assignment rounds, a plurality of threads to perform track assignment on the plurality of wire panel groups based on (e.g., while considering) a first panel bound and a second panel bound, where the plurality of assignment rounds comprises the determined number of assignment rounds. For some embodiments, the scheduling comprises performing the following operations for each particular assignment round in the plurality of assignment rounds. A plurality of next panels, from the plurality of consecutive panels, can be assigned to a plurality of threads that each performs track assignment on a respective panel based on the first panel bound and the second panel bound. The next panels assigned to the plurality of threads are ones not already assigned to a thread in a prior assignment round. Additionally, the plurality of next panels can comprise panels having non-overlapping second panel bounds, which can permit some embodiments to avoid crosstalk or data collisions by track assignment threads during a given assignment round. Subsequently, the plurality of threads can be caused to be concurrently executed. Eventually, it is determined whether each of the plurality of threads has completed execution. In response to determining that each of the plurality of threads has completed execution, an embodiment can proceed to a next assignment round, in the plurality of assignment rounds, if any assignment rounds remain.

Referring now to FIG. 4, the flowchart illustrates an example method 400 for circuit design routing using track assignment based on a plurality of panels, according to some embodiments. Like the method 200 of FIG. 2, the method 400 may be performed as part of a global routing process, as part of a detailed routing process, or some part of each, as applied to a circuit design. An operation of the method 400 can be performed by a hardware processor.

The method 400, as illustrated, begins with operation 402 receiving track assignment input data. The track assignment input data can describe, without limitation, a set of wires to be track assigned, a set of cells each wire (in the set of wires) goes through, and a layer of the circuit design that each wire (in the set of wires) is disposed. For instance, the track assignment input data can identify a wire to be track assigned, index of cells the wire goes through, and the layer index of the wire.

The method 400 continues with operation 404 grouping a set of wires based on multiple panels. For example, with respect to a panel comprising a defined row of cells on each layer of a circuit design, wires falling within the panel can be grouped together (e.g., as a wire panel group).

The method 400 continues with operation 406 determining a number of track assignment rounds based on a number of panels within a hard panel bound. For some embodiments described herein, a soft panel bound represents a primary panel bound or first panel bound, and a hard panel bound represents a secondary panel bound or a second panel bound. For instance, where the hard panel bound comprises three panels (and the soft panel bound comprises a single panel), operation 406 can determine that three track assignment rounds will be performed. The primary panel bound and the secondary panel bound can be predetermined by a user (e.g., user of an EDA) prior to the routing process commencing, and can be predetermined by the user prior to a circuit design routing process (e.g., global routing process) commencing.

The method 400 continues with operation 408 determining thread and panel assignments based on the hard panel bound. In particular, for those panels not yet assigned to/processed by a thread by a prior track assignment round, a set of panels are selected for track assignment based on the hard panel bound (e.g., panels that do not have overlapping hard panel bounds, which can avoid crosstalk or data collision by different threads executing concurrently during a given track assignment round).

The method 400 continues with operation 410 performing, by threads assigned at operation 408, track assignment of a set of wires of a set of current assigned panels based on a soft panel bound and a hard panel bound. The method 400 continues with operation 412 updating one or more wire assignment statuses for panels within the hard panel bound based on the track assignment performed by operation 410.

The method 400 continues with operation 414 determining whether all panels assigned to threads for the current track assignment round have completed. In response to all assigned panels being completed during the current track assignment round, the method 400 proceeds to operation 416, otherwise the method 400 continues to wait for all assigned panels to complete at operation 414. Operation 416 determines whether all track assignment rounds have completed. In response to determining that all track assignment rounds have completed, the method 400 continues with operation 418, otherwise the method 400 returns to operation 408 determining thread and panel assignments for a next track assignment round.

Operation 418 generates one or more local connections of track-assigned wires based the track assignments determined by one or more track assignment rounds performed via operations 408 through 416. Subsequently, the track-assigned wires and generated local connections can be stored in data (e.g., exported to a database) used by a subsequent circuit design process, such as a detailed routing process.

Figure 5:
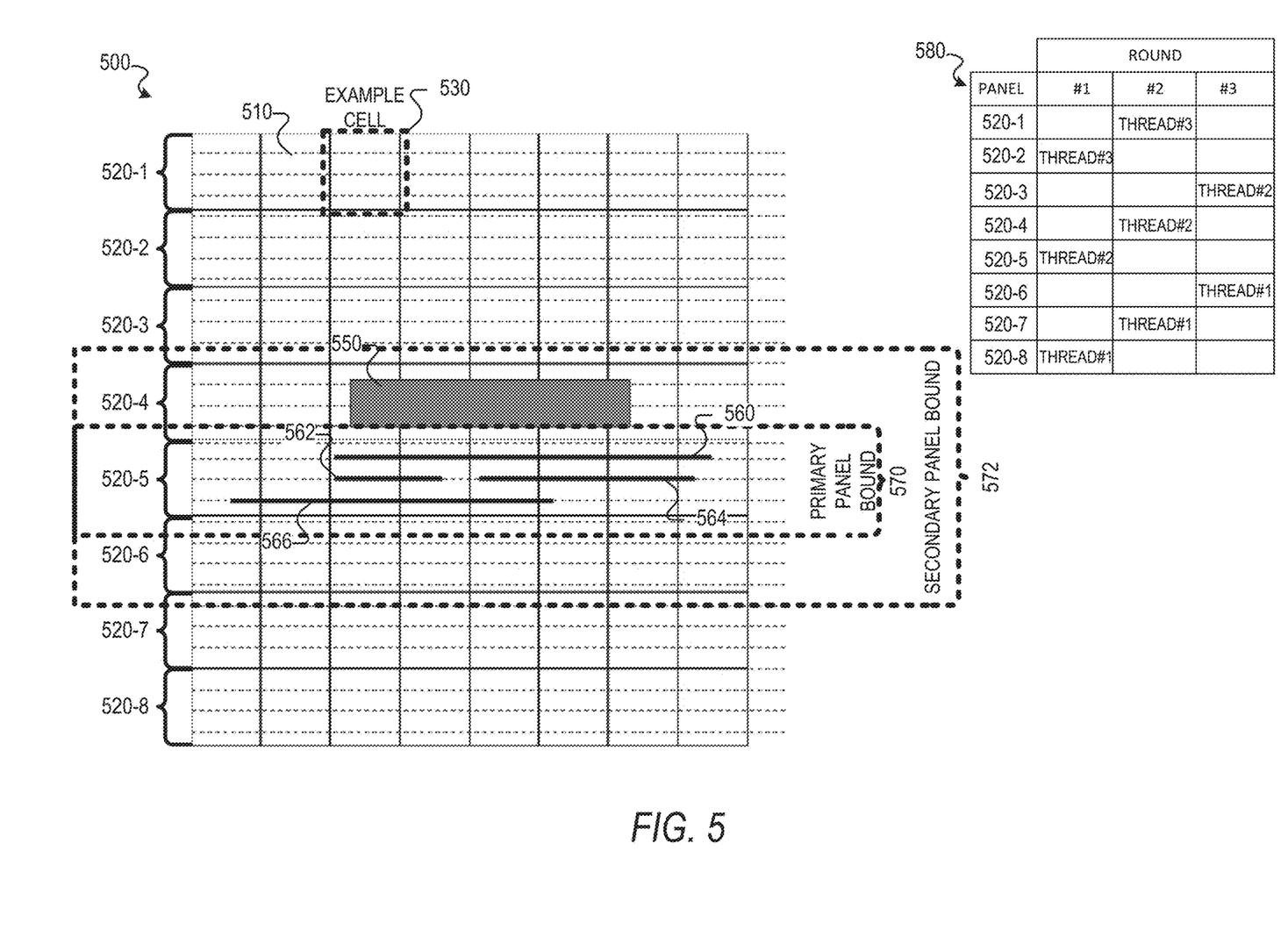
FIG. 5 is a diagram illustrating an example track assignment based on multiple panels, according to some embodiments.

FIG. 5 is a diagram illustrating example track assignment based on multiple panels, according to some embodiments. In particular, the diagram illustrates a grid 500 of cells (e.g., cell 530) over a plurality of layers of a circuit design, where each row of the grid 500 forms a panel 520 across each layer of the plurality of layers. For the sake of simplicity, FIG. 5 illustrates the grid 500 with respect to a single layer of the circuit design. It will be understood that each panel 520 can traverse across multiple layers of the circuit design, thereby causing each panel 520 to comprise a cross section of the circuit design. For each layer of the circuit design, each panel 520 comprises a plurality of tracks (e.g., track 510) to which a wire can be assigned.

FIG. 5 illustrates an example track assignment according to some embodiments, which can performed by one or more methods described above with respect to FIGS. 2 through 4. As illustrated, track assignment can be performed on a particular panel 520-5 based on a primary panel bound 570 (comprising a single panel) and a secondary panel bound 572 (comprising three panels). As shown, wires 560, 562, 564, 566 are assigned to tracks 510 within the particular panel 520-5 based on the primary panel bound 570 and the secondary panel bound 572, which causes track assignment of wires 560, 562, 564, 566 in view of routing blockage 550.

Table 580 represents example assignments of track assignment threads (e.g., thread#1, thread#2, thread#3) to panels 520-1 through 520-8, based on the secondary panel bound 572, across track assignment rounds (round#1, round#2, round#3). As illustrated, for round#1, panels 520-2, 520-5, 520-8 are selected and respectively assigned to thread#1, thread#2, and thread#3, thereby avoiding secondary panel bounds of panels 520-2, 520-5, 520-8 from overlapping during round#1. For the next round (round#2), panels 520-1, 520-4, 520-7 .e., panels immediately above the assigned panels of round#1) are selected and respectively assigned to thread#1, thread#2, and thread#3, thereby avoiding secondary panel bounds of panels 520-1, 520-4, 520-7 from overlapping during round#2. For the next round (round#3), panels 520-3, 520-6 (the last two remaining panels illustrated) are selected and respectively assigned to thread#1 and thread#2, thereby avoiding secondary panel bounds of panels 520-3, 520-6 from overlapping during round#3. This pattern of thread and panel assignments can continue until all track assignment rounds have completed.

Figure 6:
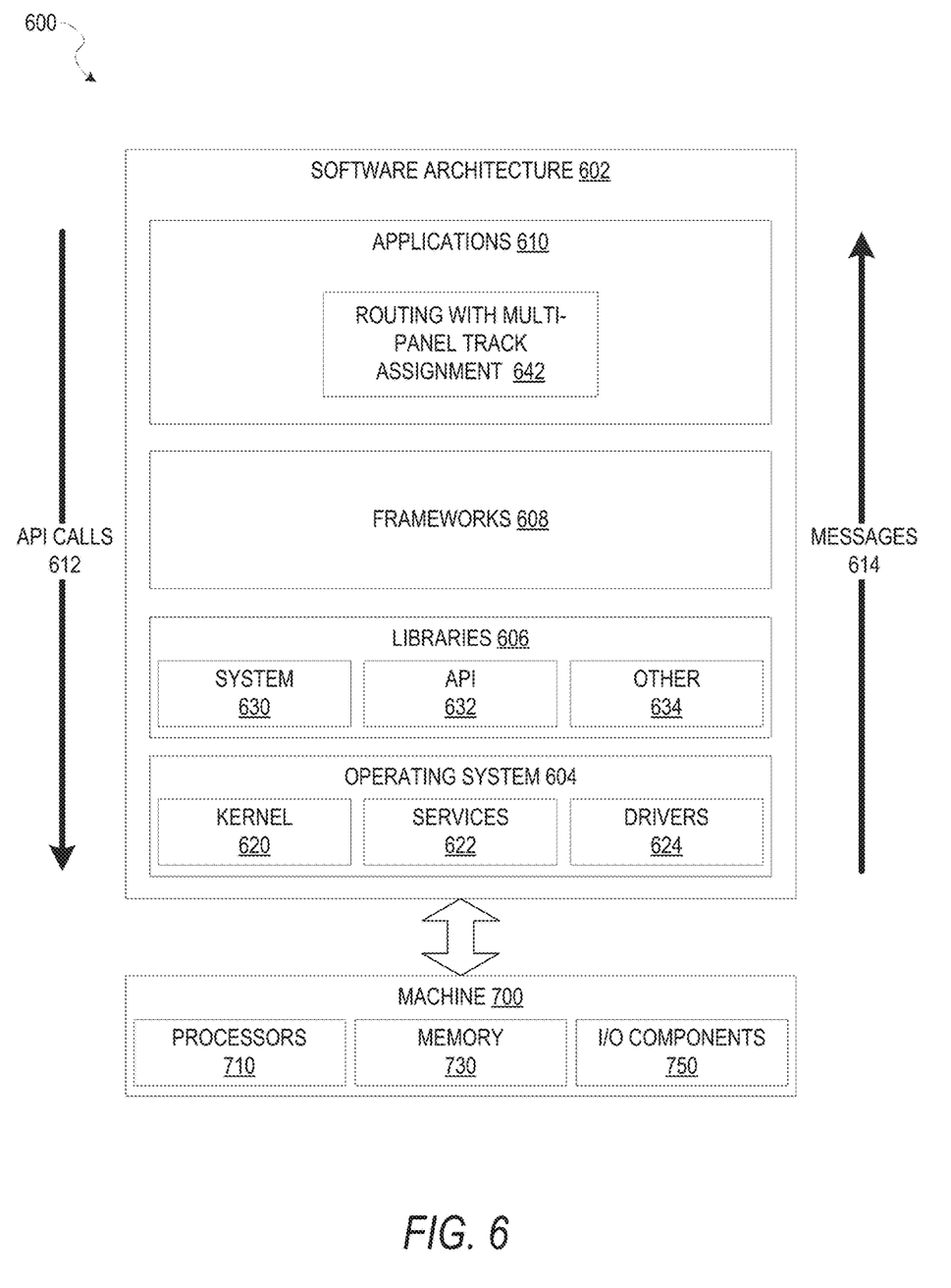
FIG. 6 is a block diagram illustrating an example of a software architecture that may be operating on an electronic design automation (EDA) computing device and may be used with methods for circuit design routing using track assignment based on a plurality of panels, according to some embodiments.
Figure 7:
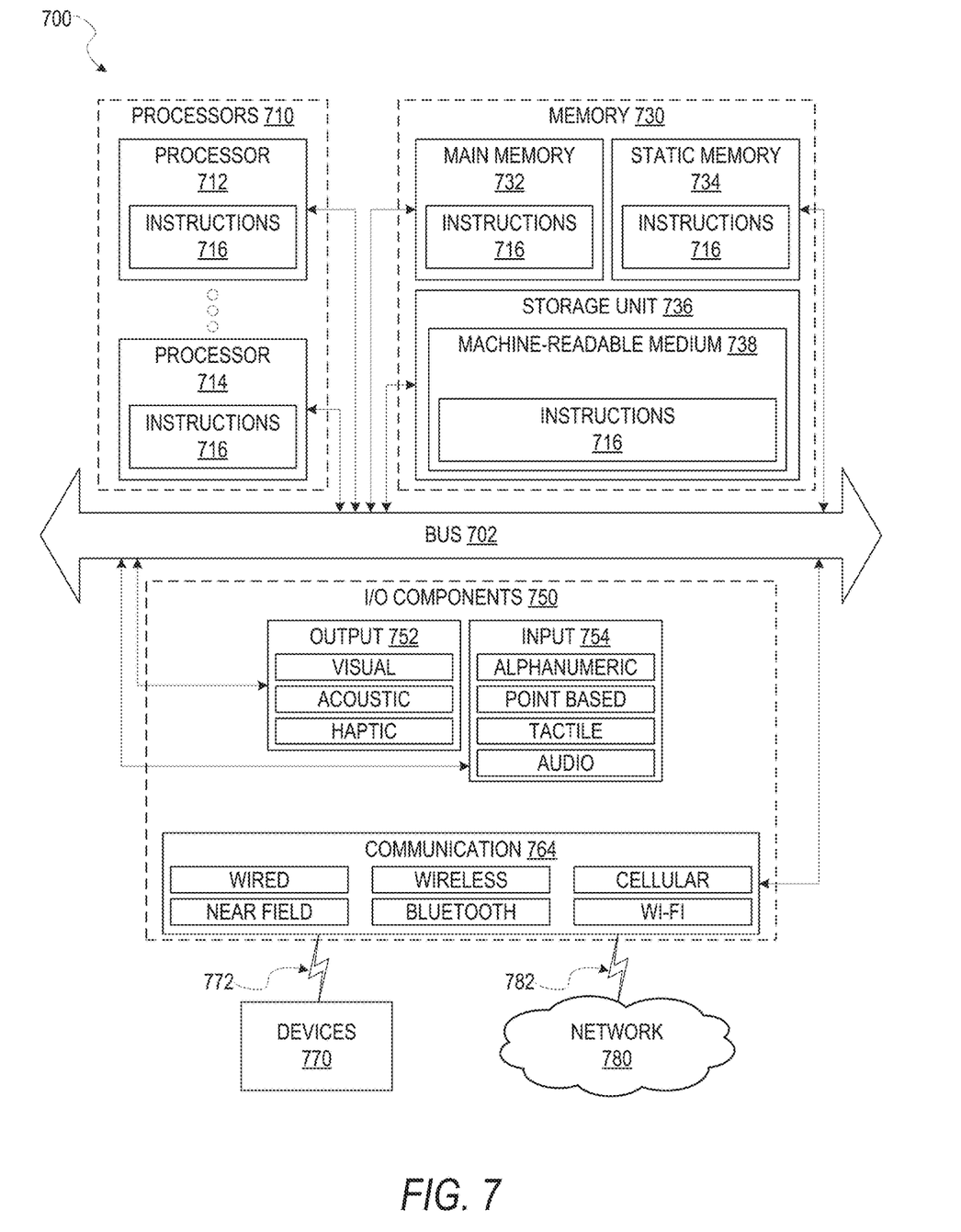
FIG. 7 is a diagram representing a machine in the form of a computer system within which a set of instructions are executed, causing the machine to perform any one or more of the methods discussed herein, according to some example embodiments.

FIG. 6 is a block diagram 600 illustrating an example of a software architecture 602 that may be operating on an EDA computer and may be used with methods for routing a circuit design (e.g., routing a network of the circuit design) using track assignment based on a plurality of panels 520, according to some example embodiments. The software architecture 602 can be used as an EDA computing device to implement any of the methods described above. Aspects of the software architecture 602 may, in various embodiments, be used to store circuit designs, and to route a circuit design using multi-panel track assignment in an EDA environment to generate circuit designs, from which physical devices may be generated.

FIG. 6 is merely a non-limiting example of a software architecture 602, and it will be appreciated that many other architectures can be implemented to facilitate the functionality described herein. In various embodiments, the software architecture 602 is implemented by hardware such as a machine 700 of FIG. 7 that includes processors 710, memory 730, and I/O components 750. In this example, the software architecture 602 can be conceptualized as a stack of layers where each layer may provide a particular functionality. For example, the software architecture 602 includes layers such as an operating system 604, libraries 606, software frameworks 608, and applications 610. Operationally, the applications 610 invoke application programming interface (API) calls 612 through the software stack and receive messages 614 in response to the API calls 612, consistent with some embodiments. In various embodiments, any client device, any server computer of a server system, or any other device described herein may operate using elements of the software architecture 602. An EDA computing device described herein may additionally be implemented using aspects of the software architecture 602, with the software architecture 602 adapted for operating to perform routing a net of a circuit design in any manner described herein.

In one embodiment, an EDA application of the applications 610 performs routing a circuit design (e.g., a network of the circuit design) using track assignment based on a plurality of panels according to embodiments described herein using various modules within the software architecture 602. For example, in one embodiment, an EDA computing device similar to the machine 700 includes the memory 730 and the one or more processors 710. The processors 710 also implement a routing with multi-panel track assignment module 642 for routing a circuit design (e.g., a network of the circuit design) using track assignment based on a plurality of panels in accordance with various embodiments described herein.

In various other embodiments, rather than being implemented as modules of the one or more applications 610, the routing based on routing with multi-panel track assignment module 642 may be implemented using elements of the libraries 606, the operating system 604, or the software frameworks 608.

In various implementations, the operating system 604 manages hardware resources and provides common services. The operating system 604 includes, for example, a kernel 620, services 622, and drivers 624. The kernel 620 acts as an abstraction layer between the hardware and the other software layers, consistent with some embodiments. For example, the kernel 620 provides memory management, processor management (e.g., scheduling), component management, networking, and security settings, among other functionality, The services 622 can provide other common services for the other software layers. The drivers 624 are responsible for controlling or interfacing with the underlying hardware, according to some embodiments. For instance, the drivers 624 can include display drivers, signal-processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 606 provide a low-level common infrastructure utilized by the applications 610. The libraries 606 can include system libraries 630 such as libraries of blocks for use in an EDA environment or other libraries that can provide functions such as memory allocation functions, string manipulation functions, mathematic functions, and the like. In addition, the libraries 606 can include API libraries 632 such as media libraries (e.g., libraries to support presentation and manipulation of various media formats such as Joint Photographic Experts Group (JPEG or JPG), or Portable Network Graphics (PNG)), graphics libraries (e.g., an OpenGL framework used to render in two dimensions (2D) and three dimensions (3D) in a graphic context on a display), database libraries (e.g., SQLite to provide various relational database functions), web libraries (e.g., WebKit to provide web browsing functionality), and the like. The libraries 606 may also include other libraries 634.

The software frameworks 608 provide a high-level common infrastructure that can be utilized by the applications 610, according to some embodiments. For example, the software frameworks 608 provide various graphic user interface (GUI) functions, high-level resource management, high-level location services, and so forth. The software frameworks 608 can provide a broad spectrum of other APIs that can be utilized by the applications 610, some of which may be specific to a particular operating system 604 or platform. In various embodiments, the systems, methods, devices, and instructions described herein may use various files, macros, libraries, and other elements of an FDA design environment to implement circuit design routing using track assignment based on a plurality of panels as described herein. This includes analysis of input design files for an integrated circuit design, along with any element of hierarchical analysis that may be used as part of or along with the embodiments described herein. While netlist files, library files, SDC files, and view definition files are examples that may operate within the software architecture 602, it will be apparent that other files and structures may provide a similar function, in various embodiments.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various example embodiments, one or more computer systems (e.g., a standalone computer system, a client computer system, or a server computer system) or one or more hardware modules of a computer system (e.g., a processor or a group of processors) are configured by software (e.g., an application or application portion) as a hardware module that operates to perform certain operations as described herein.

In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a field-programmable gate array (FPGA) or an application-specific integrated circuit (AMC). A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between or among such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. As used herein, "processor-implemented module" refers to a hardware module implemented using one or more processors.

Similarly, the methods described herein can be at least partially processor-implemented, with a particular processor or processors being an example of hardware. For example, at least some of the operations of a method can be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines 700 including processors 710), with these operations being accessible via a network (e.g., the Internet) and via one or more appropriate interfaces (e.g., an API). In certain embodiments, for example, a client device may relay or operate in communication with cloud computing systems, and may access circuit design information in a cloud environment.

The performance of certain of the operations may be distributed among the processors, not only residing within a single machine 700, but deployed across a number of machines 700. In some example embodiments, the processors 710 or processor-implemented modules are located in a single geographic location (e.g., within a home environment, an office environment, or a server farm). In other example embodiments, the processors or processor-implemented modules are distributed across a number of geographic locations.

FIG. 7 is a diagrammatic representation of the machine 700 in the form of a computer system within which a set of instructions may be executed for causing the machine 700 to perform any one or more of the methodologies discussed herein, according to an example embodiment. FIG. 7 shows components of the machine 700, which is, according to some embodiments, able to read instructions from a machine-readable medium (e.g., a machine-readable storage medium) and perform any one or more of the methodologies discussed herein. Specifically, FIG. 7 shows a diagrammatic representation of the machine 700 in the example form of a computer system, within which instructions 716 (e.g., software, a program, an application, an applet, an app, or other executable code) for causing the machine 700 to perform any one or more of the methodologies discussed herein can be executed. In alternative embodiments, the machine 700 operates as a standalone device or can be coupled (e.g., networked) to other machines. In a networked deployment, the machine 700 may operate in the capacity of a server machine or a client machine in a server-client network environment, or as a peer machine in a peer-to-peer (or distributed) network environment. The machine 700 can comprise, but not be limited to, a server computer, a client computer, a personal computer (PC), a tablet computer, a laptop computer, a netbook, or any machine capable of executing the instructions 716, sequentially or otherwise, that specify actions to be taken by the machine 700. Further, while only a single machine 700 is illustrated, the term "machine" shall also be taken to include a collection of machines 700 that individually or jointly execute the instructions 716 to perform any one or more of the methodologies discussed herein.

In various embodiments, the machine 700 comprises processors 710, memory 730, and I/O components 750, which can be configured to communicate with each other via a bus 702. In an example embodiment, the processors 710 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another processor, or any suitable combination thereof) include, for example, a processor 712 and a processor 714 that may execute the instructions 716. The term "processor" is intended to include multi-core processors 710 that may comprise two or more independent processors 712, 714 (also referred to as "cores") that can execute the instructions 716 contemporaneously. Although FIG. 7 shows multiple processors 710, the machine 700 may include a single processor 712 with a single core, a single processor 712 with multiple cores (e.g., a multi-core processor 712), multiple processors 710 with a single core, multiple processors 710 with multiple cores, or any combination thereof.

The memory 730 comprises a main memory 732, a static memory 734, and a storage unit 736 accessible to the processors 710 via the bus 702, according to some embodiments. The storage unit 736 can include a machine-readable medium 738 on which are stored the instructions 716 embodying any one or more of the methodologies or functions described herein. The instructions 716 can also reside, completely or at least partially, within the main memory 732, within the static memory 734, within at least one of the processors 710 (e.g., within the processor's cache memory), or any suitable combination thereof, during execution thereof by the machine 700. Accordingly, in various embodiments, the main memory 732, the static memory 734, and the processors 710 are considered machine-readable media 738.

As used herein, the term "memory" refers to a machine-readable medium 738 able to store data temporarily or permanently and may be taken to include, but not be limited to, random-access memory (RAM), read-only memory (ROM), buffer memory, flash memory, and cache memory. While the machine-readable medium 738 is shown, in an example embodiment, to be a single medium, the term "machine-readable medium" should be taken to include a single medium or multiple media (e.g., a centralized or distributed database, or associated caches and servers) able to store the instructions 716. The term "machine-readable medium" shall also be taken to include any medium, or combination of multiple media, that is capable of storing instructions (e.g., the instructions 716) for execution by a machine (e.g., the machine 700), such that the instructions, when executed by one or more processors of the machine (e.g., the processors 710), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 750 include a wide variety of components to receive input, provide output, produce output, transmit information, exchange information, capture measurements, and so on. In general, it will be appreciated that the I/O components 750 can include many other components that are not shown in FIG. 7. The I/O components 750 are grouped according to functionality merely for simplifying the following discussion, and the grouping is in no way limiting. In various example embodiments, the I/O components 750 include output components 752 and input components 754. The output components 752 include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 754 include alphanumeric input components (e.g., a keyboard, a touch screen configured to receive alphanumeric input, a photo-optical keyboard, or other alphanumeric input components), point-based input components (e.g., a mouse, a touchpad, a trackball, or other pointing instruments), tactile input components (e.g., a physical button, a touch screen that provides location and force of touches or touch gestures, or other tactile input components), audio input components (e.g., a microphone), and the like.

In some embodiments, outputs from an EDA computing device may include design documents, files for additional steps in a design flow, or outputs for circuit fabrication. As described herein, "constraints," "requirements," "design elements," and other aspects of a circuit design refer to selectable values that are set as part of the design of a circuit. Such design constraints, requirements, or elements may be adjusted by a system operator or circuit designer to suit the particular goals of a project or circuit that results from the operations described herein.

Communication can be implemented using a wide variety of technologies. The I/O components 750 may include communication components 764 operable to couple the machine 700 to a network 780 or devices 770 via a coupling 782 and a coupling 772, respectively. For example, the communication components 764 include a network interface component or another suitable device to interface with the network 780. In further examples, the communication components 764 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 770 may be another machine or any of a wide variety of peripheral devices (e.g., a peripheral device coupled via a USB).

In various example embodiments, one or more portions of the network 780 can be an ad hoc network, an intranet, an extranet, a virtual private network (VPN), a local area network (LAN), a wireless LAN (WLAN), a wide area network (WAN), a wireless WAN (WWAN), a metropolitan area. network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 780 or a portion of the network 780 may include a wireless or cellular network, and the coupling 782 may be a Code Division Multiple Access (CDMA) connection, a Global System for Mobile communications (GSM) connection, or another type of cellular or wireless coupling.

Furthermore, the machine-readable medium 738 is non-transitory (in other words, not having any transitory signals) in that it does not embody a propagating signal. However, labeling the machine-readable medium 738 "non-transitory" should not be construed to mean that the machine-readable medium 738 is incapable of movement; the machine-readable medium 738 should be considered as being transportable from one physical location to another. Additionally, since the machine-readable medium 738 is tangible, the machine-readable medium 738 may be considered to be a machine-readable device.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A method comprising:
    dividing, by a hardware processor, a circuit design into a grid of cells that forms a plurality of consecutive panels, each panel in the plurality of consecutive panels comprising a defined row of cells of the grid of cells;
    routing, by the hardware processor, a network of the circuit design based on the grid of cells; and
    performing, by the hardware processor, a track assignment for a set of wires of the network based on the plurality of consecutive panels, a first panel bound, and a second panel bound, the first panel bound defining a first set of consecutive panels relative to a particular panel of the plurality of consecutive panels, the second panel bound defining a second set of consecutive panels relative to the particular panel, and the second set of consecutive panels being larger than the first set of consecutive panels.

2. The method of claim 1, wherein the performing the track assignment for the set of wires based on the plurality of consecutive panels, the first panel bound and the second panel bound comprises:
    grouping the set of wires according to the plurality of consecutive panels to produce a plurality of wire panel groups;
    determining a number of assignment rounds based on a number of panels falling within the second panel bound; and
    scheduling, based on a plurality of assignment rounds, a plurality of threads to perform a track assignment on the plurality of wire panel groups based on the first panel bound and the second panel bound, the plurality of assignment rounds comprising the determined number of assignment rounds.

3. The method of claim 2, wherein the scheduling, based on the plurality of assignment rounds, the plurality of threads to perform a track assignment on the plurality of wire panel groups based on the first panel bound and the second panel bound comprises:
    for each particular assignment round in the plurality of assignment rounds:
    assigning a plurality of next panels, from the plurality of consecutive panels, to a plurality of threads that each performs a track assignment on a respective panel based on the first panel bound and the second panel bound, the plurality of next panels comprising panels not assigned to a thread in a prior assignment round;
    causing the plurality of threads to be concurrently executed;
    determining whether each thread of the plurality of threads has completed execution; and proceeding to any remaining assignment rounds, in the plurality of assignment rounds, in response to determining that each thread of the plurality of threads has completed execution.

4. The method of claim 3, wherein the plurality of next panels comprises panels having non-overlapping second panel bounds.

5. The method of claim 2, wherein the determined number of assignment rounds equals the number of panels falling within the second panel bound.

6. The method of claim 1, wherein the first set of consecutive panels comprises a single panel, and the second set of consecutive panels comprises three panels.

7. The method of claim 1, wherein the second set of consecutive panels comprises the particular panel, a first panel adjacent to a top border of the particular panel, and a second panel adjacent to a bottom border of the particular panel.

8. The method of claim 7, wherein the second set of consecutive panels further comprises a third panel adjacent to a top border of the first panel, and a fourth panel adjacent to a bottom border of the second panel.

9. The method of claim 1, wherein each panel in the plurality of consecutive panels comprises a set of tracks that traverse across a different row of cells of the grid of cells.

10. The method of claim 9, wherein the circuit design comprises a plurality of layers, and each different row of cells of the grid of cells is disposed on each layer of the plurality of layers.

11. The method of claim 1, wherein the routing is performed as a part of a global routing process.

12. A device comprising:
a memory storing instructions; and
a hardware processor communicatively coupled to the memory and configured by the instructions to perform operations comprising:
routing a network of a circuit design based on a grid of cells that divides the circuit design and forms a plurality of consecutive panels, each panel in the plurality of consecutive panels comprising a defined row of cells of the grid of cells; and
performing a track assignment for a set of wires of the network based on the plurality of consecutive panels, a first panel bound, and a second panel bound, the first panel bound defining a first set of consecutive panels relative to a particular panel of the plurality of consecutive panels, the second panel bound defining a second set of consecutive panels relative to the particular panel, and the second set of consecutive panels being larger than the first set of consecutive panels.

13. The device of claim 12, wherein the performing the track assignment for the set of wires based on the plurality of consecutive panels, the first panel bound and the second panel bound comprises:
grouping the set of wires according to the plurality of consecutive panels to produce a plurality of wire panel groups;
determining a number of assignment rounds based on a number of panels falling within the second panel bound; and
scheduling, based on a plurality of assignment rounds, a plurality of threads to perform a track assignment on the plurality of wire panel groups based on the first panel bound and the second panel bound, the plurality of assignment rounds comprising the determined number of assignment rounds.

14. The device of claim 13, wherein the scheduling, based on the plurality of assignment rounds, the plurality of threads to perform a track assignment on the plurality of wire panel groups based on the first panel bound and the second panel bound comprising:
for each particular assignment round in the plurality of assignment rounds:
assigning a plurality of next panels, from the plurality of consecutive panels, to a plurality of threads that each performs a track assignment on a respective panel based on the first panel bound and the second panel bound, the plurality of next panels comprising panels not assigned to a thread in a prior assignment round;
causing the plurality of threads to be concurrently executed;
determining whether each thread of the plurality of threads has completed execution; and
proceeding to any remaining assignment rounds, in the plurality of assignment rounds, in response to determining that each thread of the plurality of threads has completed execution.

15. The device of claim 14, wherein the plurality of next panels comprises panels having non-overlapping second panel bounds.

16. The device of claim 13, wherein the determined number of assignment rounds equals the number of panels falling within the second panel bound.

17. The device of claim 12, wherein the first set of consecutive panels comprises a single panel, and the second set of consecutive panels comprises three panels.

18. The device of claim 12, wherein the second set of consecutive panels comprises the particular panel, a first panel adjacent to a top border of the particular panel, and a second panel adjacent to a bottom border of the particular panel.

19. The device of claim 18, wherein the second set of consecutive panels further comprises a third panel adjacent to a top border of the first panel, and a fourth panel adjacent to a bottom border of the second panel.

20. A non-transitory computer-readable medium comprising instructions that, when executed by a hardware processor of a device, cause the device to perform operations comprising:
routing a network of a circuit design based on a grid of cells that divides the circuit design and forms a plurality of consecutive panels, each panel in the plurality of consecutive panels comprising a defined row of cells of the grid of cells; and
performing a track assignment for a set of wires of the network by:
grouping the set of wires according to the plurality of consecutive panels to produce a plurality of wire panel groups;
determining a number of assignment rounds based on a number of panels falling within a second panel bound; and
scheduling, based on a plurality of assignment rounds, a plurality of threads to perform track assignment on the plurality of wire panel groups based on a first panel bound, and the second panel bound, the first panel bound being smaller than the second panel bound, and the plurality of assignment rounds comprising the determined number of assignment rounds.

* * * * *